United States Patent
Naruse et al.

(10) Patent No.: US 9,041,413 B2
(45) Date of Patent: May 26, 2015

(54) ELECTRIC LEAKAGE DETECTION APPARATUS

(75) Inventors: Hideaki Naruse, Iida (JP); Satoru Miyamoto, Iida (JP); Masaki Fujii, Iida (JP); Kazushi Kodaira, Iida (JP); Yoshihiro Ikushima, Iida (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 464 days.

(21) Appl. No.: 13/398,658

(22) Filed: Feb. 16, 2012

(65) Prior Publication Data
US 2012/0206153 A1 Aug. 16, 2012

(30) Foreign Application Priority Data

Feb. 16, 2011 (JP) ................... 2011-030399

(51) Int. Cl.
*G01N 27/00* (2006.01)
*G01R 31/02* (2006.01)
*B60L 3/00* (2006.01)

(52) U.S. Cl.
CPC ............. *G01R 31/025* (2013.01); *B60L 3/0069* (2013.01)

(58) Field of Classification Search
None
See application file for complete search history.

(56) References Cited

U.S. PATENT DOCUMENTS 6,646,513 B1 * 11/2003 Neidorff ....................... 331/143
7,705,605 B2 4/2010 Hayakawa et al.
2002/0121902 A1 * 9/2002 Suzuki ......................... 324/509
2007/0188948 A1 * 8/2007 Morita ........................... 361/42
2009/0237001 A1 * 9/2009 Inukai .......................... 315/291

FOREIGN PATENT DOCUMENTS

JP 2003-250201 A 9/2003
JP 2008-089322 A 4/2008

OTHER PUBLICATIONS

Patent Abstracts of Japan for Japanese Publication No. 2003-250201 publication date Sep. 5, 2003 (1 page).
Patent Abstracts of Japan for Japanese Publication No. 2008-089322, publication date Apr. 17, 2008 (1 page).

\* cited by examiner

*Primary Examiner* — Melissa Koval
*Assistant Examiner* — Courtney McDonnough
(74) *Attorney, Agent, or Firm* — Osha • Liang LLP

(57) ABSTRACT

An electric leakage detection apparatus may quickly detect an electric leakage. An electric leakage detection apparatus includes a pulse generator that supplies a pulse to a coupling capacitor, a voltage detector that detects a voltage at the coupling capacitor, an electric leakage determination unit that compares the voltage detected by the voltage detector to a first threshold and determines presence or absence of the electric leakage of a DC power supply based on a comparison result. The electric leakage detection apparatus also includes a discharge determination unit that compares the voltage detected by the voltage detector to a second threshold lower than the first threshold and determines whether the detection voltage becomes lower than the second threshold by a discharge of the coupling capacitor. The pulse generator generates a new pulse when the discharge determination unit determines that the detection voltage becomes lower than the second threshold.

5 Claims, 5 Drawing Sheets

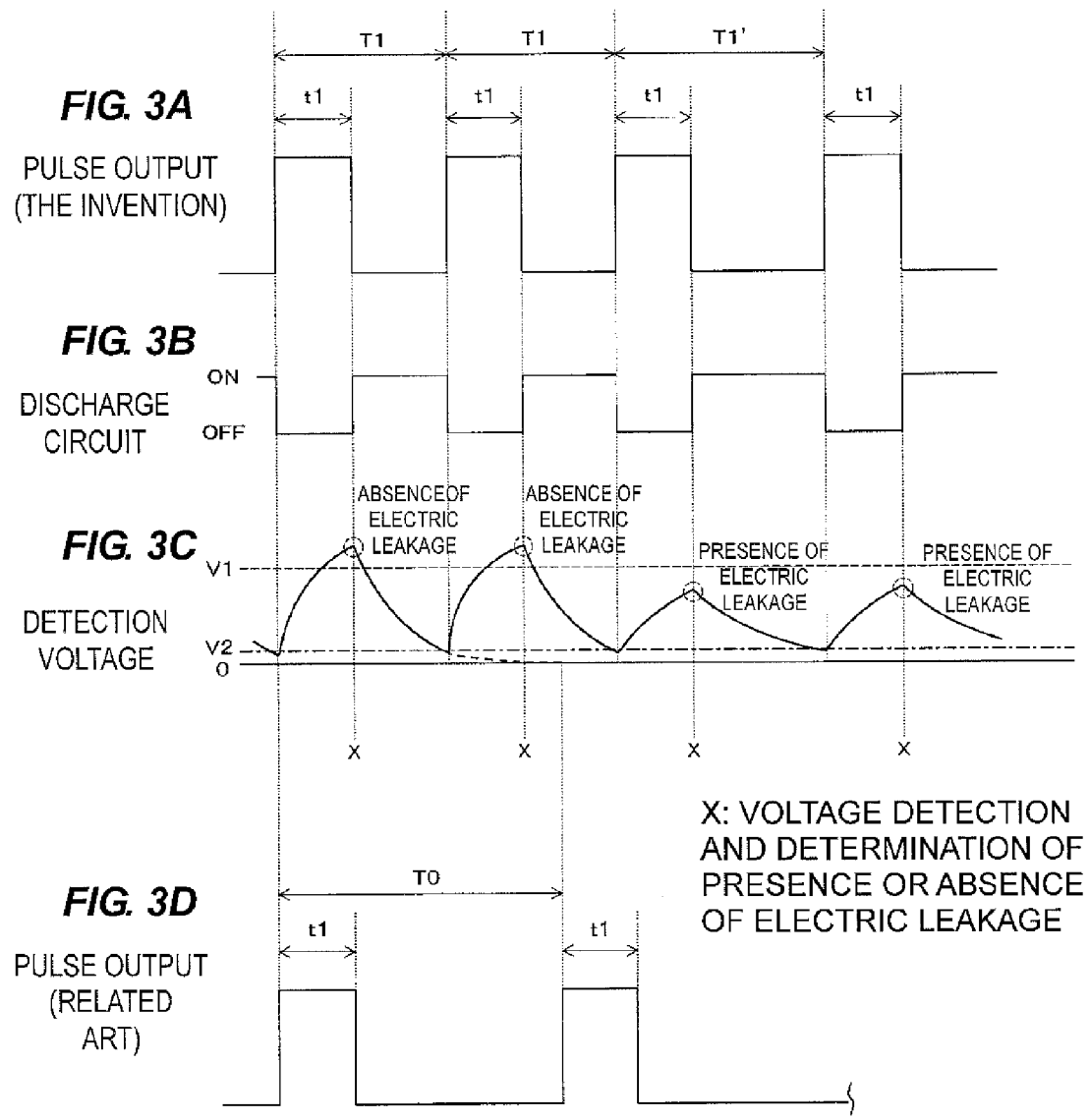

PULSE
OUTPUT

DISCHARGE ON
CIRCUIT OFF

DETECTION V1
VOLTAGE
V2
0

ABNORMALITY
DETERMINATION

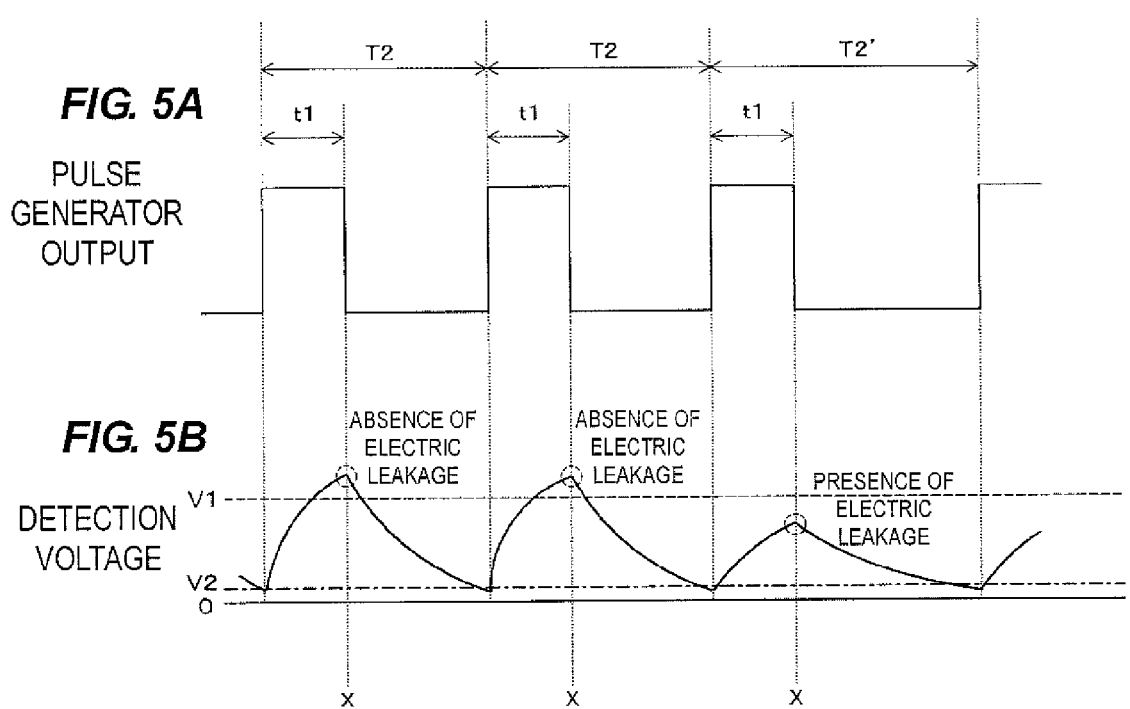

ELECTRIC LEAKAGE DETECTION APPARATUS

CROSS-REFERENCE TO RELATED APPLICATIONS

The present application claims priority from Japanese Patent Application No. 2011-030399, filed Feb. 16, 2011. The content of the priority application is hereby incorporated by reference in its entirety.

BACKGROUND OF INVENTION

1. Technical Field

One or more embodiments of the present invention relate to an electric leakage detection apparatus that detects an electric leakage of a DC power supply.

2. Related Art

A high-voltage DC power supply is mounted on an electric automobile in order to drive a motor and an in-vehicle instrument. The DC power supply is electrically insulated from a grounded vehicle body. However, when the DC power supply and the vehicle body are electrically connected for any cause, a current is passed from the DC power supply to the ground through the vehicle body to generate an electric leakage (or a ground fault). Therefore, a detection apparatus that detects the electric leakage is provided in the DC power supply. Japanese Unexamined Patent Publication No. 2003-250201 discloses a ground fault detection apparatus mounted on the electric automobile.

In the vehicle ground fault detection apparatus of Japanese Unexamined Patent Publication No. 2003-250201, a positive terminal of the DC power supply is connected onto one end side of a coupling capacitor, the coupling capacitor is charged by applying a rectangular wave pulse signal to a measuring point that constitutes the other end side of the coupling capacitor, and a voltage signal generated at the measuring point is detected to detect the ground fault of the DC power supply. A difference between a voltage measured at the measuring point at the time the rectangular wave pulse signal becomes a first phase and a voltage measured at the measuring point at the time the rectangular wave pulse signal becomes a second phase is obtained, and the ground fault of the DC power supply is detected based on the difference of the voltage.

In the vehicle ground fault detection apparatus of Japanese Unexamined Patent Publication No. 2003-250201, a cycle of the pulse supplied to the coupling capacitor is kept constant. After a charge of the coupling capacitor is completed, a discharge from the coupling capacitor is started, and it takes a predetermined time to decrease a voltage at the measuring point to 0 volts since the discharge is started. A time interval after the pulse falls until a next pulse rises is set equal to or more than the predetermined time required for the discharge. Therefore, when a determination of the presence or absence of the ground fault is made by detecting the voltage at the timing the pulse falls or rises, a time interval from the pulse fall to the pulse rise is lengthened to cause an issue in that it takes time to make a determination.

Japanese Unexamined Patent Publication No. 2008-89322 discloses an apparatus that detects an insulating state of the DC power supply based on the voltage at the capacitor. In this apparatus, a reset switch is provided in order to discharge the capacitor, the apparatus waits for the voltage between both ends of the capacitor to be decreased to a given voltage when the voltage between both the ends of the capacitor exceeds a maximum voltage during a normal operation, and the reset switch is powered on to rapidly charge the capacitor when the voltage between both the ends of the capacitor becomes the given voltage.

SUMMARY OF INVENTION

One or more embodiments of the present invention may quickly determine presence or absence of an electric leakage in an electric leakage detection apparatus that detects an electric leakage of a DC power supply.

According to one or more embodiments of the present invention, an electric leakage detection apparatus includes: a coupling capacitor whose one end is connected to a DC power supply; a pulse generator that supplies a pulse to the other end of the coupling capacitor; a voltage detector that detects a voltage at the coupling capacitor charged with the pulse; an electric leakage determination unit that compares the voltage detected by the voltage detector to a first threshold and determines presence or absence of an electric leakage of the DC power supply based on a comparison result; and a discharge determination unit that compares the voltage detected by the voltage detector to a second threshold lower than the first threshold and determines whether the voltage becomes lower than the second threshold by a discharge of the coupling capacitor. The pulse generator generates a new pulse when the discharge determination unit determines that the voltage becomes lower than the second threshold.

Therefore, the coupling capacitor charged with the pulse is discharged from a pulse falling time, and the next pulse rises when the voltage at the coupling capacitor becomes lower than the second threshold. Accordingly, the pulse interval can be shortened to quickly detect the electric leakage.

The electric leakage detection apparatus according to one or more embodiments of the present invention may further include an abnormality determination unit that determines generation of an abnormality when a state in which the detection voltage does not become lower than the second threshold is continued for a given time after the pulse falls.

Accordingly, the abnormality can be detected when the coupling capacitor cannot be normally discharged due to a breakdown of the circuit and the like.

The electric leakage detection apparatus according to one or more embodiments of the present invention may further include a discharge circuit that forcedly discharges a charge of the coupling capacitor during a time interval after the pulse falls and before the next pulse rises.

Accordingly, the charge of the coupling capacitor is rapidly discharged through the discharge circuit, so that the pulse interval can be further shortened to quickly detect the electric leakage.

In the electric leakage detection apparatus according to one or more embodiments of the present invention, the electric leakage determination unit preferably determines the presence or absence of the electric leakage at a predetermined time during a time interval after the pulse rises and before the voltage at the coupling capacitor is saturated.

Accordingly, the electric leakage determination unit can determine the presence or absence of the electric leakage before the coupling capacitor is saturated, and the electric leakage can be quickly detected.

In the electric leakage detection apparatus according to one or more embodiments of the present invention, the electric leakage determination unit preferably determines the presence or absence of the electric leakage every time the pulse generator outputs the new pulse.

Accordingly, the number of times of the electric leakage determination can be increased to more quickly detect the electric leakage.

According to the electric leakage detection apparatus of one or more embodiments of the present invention, because the next pulse rises when the voltage at the coupling capacitor becomes lower than the second threshold, the pulse interval is shortened, and the electric leakage can quickly be detected.

BRIEF DESCRIPTION OF THE DRAWINGS

FIG. 3A to 3D are a timing chart illustrating an operation of the electric leakage detection apparatus according to one or more embodiments of the present invention;

FIGS. 5A and 5B are a timing chart illustrating an operation of an electric leakage detection apparatus according to one or more embodiments of the present invention.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention. Hereinafter, embodiments of the present invention will be described with reference to the drawings. The case in which the present invention is applied to an electric leakage detection apparatus mounted on an electric automobile will be described by way of example.

Figure 1:
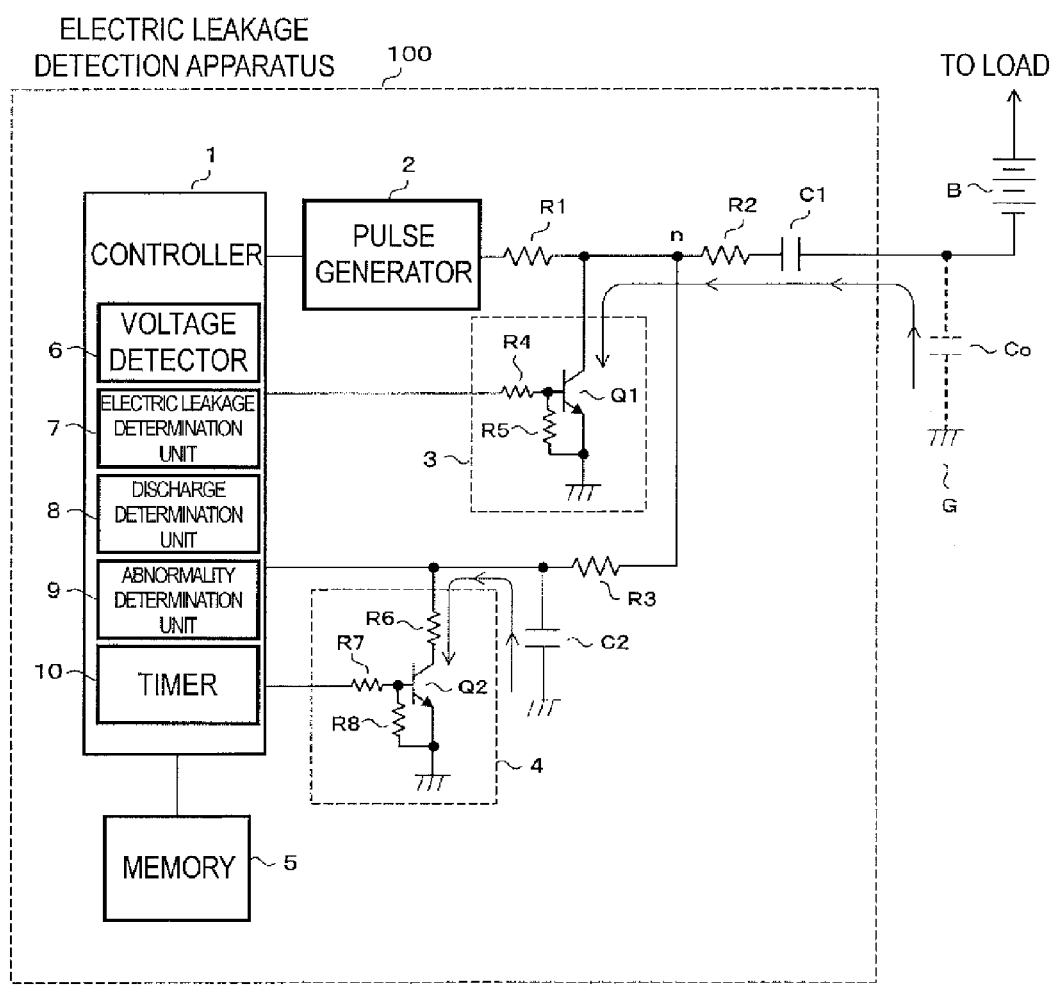
FIG. 1 is a circuit diagram illustrating an electric leakage detection apparatus according to one or more embodiments of the present invention.

As illustrated in FIG. 1, an electric leakage detection apparatus 100 includes a controller 1, a pulse generator 2, a discharge circuit 3, a discharge circuit 4, a memory 5, resistors R1 to R3, and capacitors C1 and C2.

The controller 1 is constructed by a CPU, and the controller includes a voltage detector 6, an electric leakage determination unit 7, a discharge determination unit 8, an abnormality determination unit 9, and a timer 10. The pulse generator 2 generates a pulse having a predetermined frequency in response to an instruction from the controller 1. The resistor R1 is connected to an output side of the pulse generator 2. The resistor R2 is connected to the resistor R1 in series. A value of the resistor R2 is sufficiently lower than that of the resistor R1. One end of the capacitor C1 is connected to a negative electrode of a DC power supply B, and the other end of the capacitor C1 is connected to the resistor R2. The capacitor R1 is a coupling capacitor that separates the electric leakage detection apparatus 100 and the DC power supply B in a direct-current manner. A positive electrode of the DC power supply B is connected to a load (not illustrated). A floating capacitance Co exists between the DC power supply B and a ground G (vehicle body).

The discharge circuit 3 includes a transistor Q1 and resistors R4 and R5. A collector of the transistor Q1 is connected to a connection point of the resistors R1 and R2. An emitter of the transistor Q1 is grounded. A base of the transistor Q1 is connected to the controller 1 through the resistor R4. The resistor R5 is connected to the base and the emitter of the transistor Q1. The discharge circuit 3 forcedly discharges charges of the coupling capacitor C1 and the floating capacitance Co through a route indicated by arrows.

One end of the resistor R3 is connected to the connection point of the resistor R1 and the resistor R2. The other end of the resistor R3 is connected to the controller 1. The capacitor C2 is connected between the other end of the resistor R3 and the ground. The capacitor C2 is used as a capacitor for a filter, and the capacitor C2 and the resistor R3 together constitute a filter circuit that removes a noise of a voltage input to the controller 1.

The discharge circuit 4 includes a transistor Q2 and resistors R6 to R8. A collector of the transistor Q2 is connected to a connection point of the resistor R3 and the capacitor C2 through the resistor R6. An emitter of the transistor Q2 is grounded. A base of the transistor Q2 is connected to the controller 1 through the resistor R7. The resistor R8 is connected to the base and the emitter of the transistor Q2. The discharge circuit 4 forcedly discharges a charge of the capacitor C2 through a route indicated by arrows.

The memory 5 includes a ROM and RAM to constitute a storage. A threshold V1 (first threshold) and a threshold V2 (second threshold) are stored in the memory 5.

In the controller 1, the voltage detector 6 detects a voltage at the coupling capacitor C1 based on a voltage, which is taken in the controller 1 through a connection point n of the resistors R1 and R2, the resistor R3, and the capacitor C2.

The electric leakage determination unit 7 compares the voltage detected by the voltage detector 6 to the threshold V1, and determines the presence or absence of electric leakage based on a comparison result.

The discharge determination unit 8 compares the voltage detected by the voltage detector 6 to the threshold V2 lower than the threshold V1, and determines whether the voltage becomes lower than the threshold V2 by the discharge of the coupling capacitor C1.

When an abnormality is generated in the discharge of the coupling capacitor C1, the abnormality determination unit 9 determines the abnormality.

The timer 10 measures a time interval after a pulse output from the pulse generator 2 rises until the voltage at the coupling capacitor C1 becomes lower than the threshold V2.

An operation of the electric leakage detection apparatus 100 having the above configuration will be described below.

The pulse output from the pulse generator 2 is supplied to the coupling capacitor C1 through the resistors R1 and R2. The coupling capacitor C1 is charged with this pulse (at this point, the floating capacitance Co is also charged), and a potential at a point n rises. The potential at the point n is input to the controller 1 through the resistor R3 and the capacitor C2. The voltage detector 6 detects the voltage at the coupling capacitor C1 based on the input voltage. Hereinafter, the detected voltage is referred to as a "detection voltage".

Figure 2:
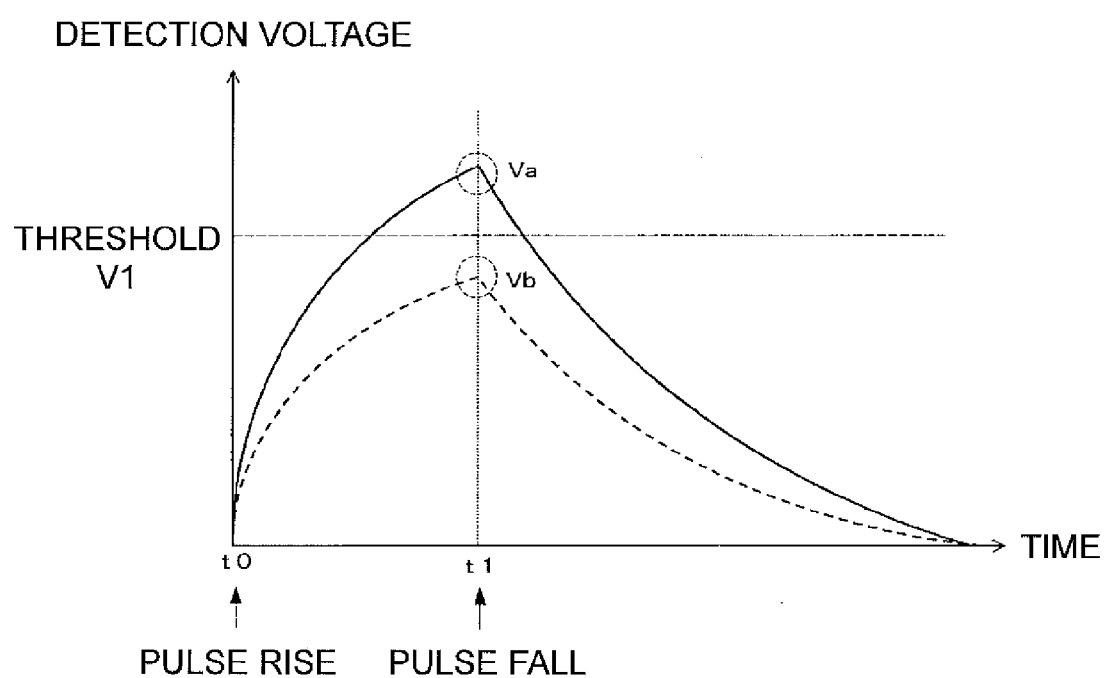
FIG. 2 is a waveform chart of detection voltages during electric leakage and non-electric leakage according to one or more embodiments of the present invention.

When the electric leakage from the DC power supply B to the ground G is not generated, the detection voltage steeply rises as illustrated by a solid line of FIG. 2. Therefore, the detection voltage exceeds the threshold V1 during the time interval after the pulse rises at a time t0 and before the pulse falls at a time t1. On the other hand, when the electric leakage from the DC power supply B to the ground G is generated, the detection voltage moderately rises by an influence of a time constant based on an electric leakage impedance as illustrated by a broken line of FIG. 2. Therefore, the detection voltage does not exceed the threshold V1 during the time interval from the time t0 to time t1.

The voltage detector 6 detects the voltage at the coupling capacitor C1 at the time t1 where the pulse falls. The time t1 is previously set during the time interval after the pulse rises and before the voltage at the coupling capacitor C1 is saturated. The detection voltage becomes Va when the electric leakage is not generated, and the detection voltage becomes Vb when the electric leakage is generated. The electric leakage determination unit 7 compares the detection voltage and the threshold V1. When the detection voltage is not lower than the threshold V1 (Va), the electric leakage determination unit determines that the electric leakage is not generated. When the detection voltage is lower than the threshold V1 (Vb), the electric leakage determination unit determines that the electric leakage is generated.

At the time t1 where the pulse falls, the controller 1 outputs a control signal to the discharge circuits 3 and 4. The control signal puts the transistors Q1 and Q2 of the discharge circuits 3 and 4 in a conduction state. Therefore, the charges of the coupling capacitor C1 and the floating capacitance Co are discharged through the transistor Q1, and the charge of the capacitor C2 is discharged through the transistor Q2. As a result, the detection voltage is decreased after the time t1 as illustrated in FIG. 2.

The basic operation of the electric leakage detection is described above. The detailed operation of the electric leakage detection apparatus 100 will be described below with reference to FIGS. 3A-3C.

As illustrated in FIG. 3A, the pulse generator 2 outputs the pulse having a pulse width t1. The voltage at the coupling capacitor C1 charged with this pulse changes as illustrated in FIG. 3C. At a pulse falling timing X, the voltage detector 6 detects the voltage at the coupling capacitor C1, and the electric leakage determination unit 7 compares the detection voltage and the threshold V1 (first threshold) to determine the presence or absence of the electric leakage.

At the pulse falling timing X, the controller 1 (see FIG. 1) simultaneously outputs the control signal to the discharge circuit 3 and the discharge circuit 4, and the transistors Q1 and Q2 of the discharge circuits 3 and 4 are simultaneously turned on as illustrated in FIG. 3B. That is, the discharge circuits 3 and 4 simultaneously start the operations. Therefore, as described above, the charge of the coupling capacitor C1 is discharged through the transistor Q1, and the charge of the capacitor C2 is discharged through the transistor Q2. At the next pulse rising timing, the transistors Q1 and Q2 of the discharge circuits 3 and 4 are simultaneously turned off.

As illustrated in FIG. 3C, the voltage detected by the voltage detector 6 is decreased after the time the coupling capacitor C1 starts the discharge. When the discharge determination unit 8 determines that the detection voltage becomes lower than the threshold V2 (second threshold), at this point, the controller 1 controls the pulse generator 2 such that the next pulse is output. Accordingly, the new pulse rises at the time the voltage at the coupling capacitor C1 becomes lower than the threshold V2.

In the present embodiment, the coupling capacitor C1 charged with the pulse is discharged from the pulse failing time, and the next pulse rises at the time the voltage at the coupling capacitor C1 becomes lower than the threshold V2. Therefore, a pulse interval T1 can be shortened to quickly detect the electric leakage.

FIG. 3D illustrates the pulse output in the case in which the threshold V2 is not provided. In this case, the next pulse rises after the voltage at the coupling capacitor C1 becomes 0 volt. Therefore, a pulse interval T0 is lengthened, and it takes a long time to detect the electric leakage.

Moreover, in the present embodiment, a cycle of the pulse is not fixed, but changes depending on the discharge state of the coupling capacitor C1. When the electric leakage from the DC power supply B to the ground G is generated, as illustrated in FIG. 3C, the discharge time of the coupling capacitor C1 is lengthened due to the electric leakage impedance, and therefore a pulse interval T1' is also lengthened. Accordingly, the whole charge of the coupling capacitor C1 is substantially discharged during the interval T1', and the detection voltage of the coupling capacitor C1 is decreased lower than the threshold V2. When the next pulse is generated while the charge remains sufficiently in the coupling capacitor C1, the coupling capacitor C1 is re-charged, and possibly the detection voltage exceeds the threshold V1 to mistakenly make a determination that the electric leakage is not generated. Therefore, in the present embodiment, the next pulse rises after the discharge state of the coupling capacitor C1 is checked based on the threshold V2.

In the present embodiment, the discharge circuit 3 is provided such that the charge of the coupling capacitor C1 is forcedly discharged through the transistor Q1 during the time interval after the pulse falls and before the next pulse rises. Therefore, the coupling capacitor C1 is rapidly discharged, so that the pulse interval can be shortened to quickly detect the electric leakage.

In the present embodiment, as described above, the electric leakage determination unit 7 determines the presence or absence of the electric leakage at the predetermined time (t1 in FIG. 2) during the time interval after the pulse rises and before the voltage at the coupling capacitor C1 is saturated. In the present embodiment, because the pulse fails before the voltage at the coupling capacitor C1 is saturated, the coupling capacitor is not charged any more. Then, the electric leakage determination unit 7 determines the presence or absence of the electric leakage at the time the pulse falls. Therefore, the electric leakage determination unit 7 can determine the presence or absence of the electric leakage before the coupling capacitor C1 is saturated, and the electric leakage can quickly be detected.

Moreover, in the present embodiment, as can be seen from FIGS. 3A-3C, the electric leakage determination unit 7 determines the presence or absence of the electric leakage every time the new pulse is generated from the pulse generator 2. Therefore, the number of times of the electric leakage determination can be increased to more quickly detect the electric leakage.

Figure 4A:
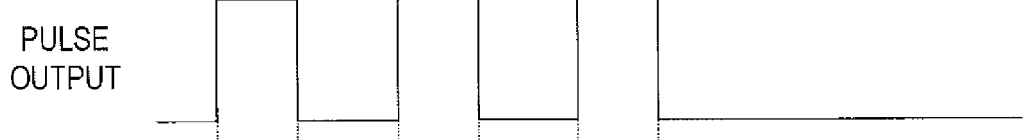
FIG. 4A to 4C are a timing chart illustrating an abnormality determination according to one or more embodiments of the present invention.
Figure 4B:
Figure 4C:
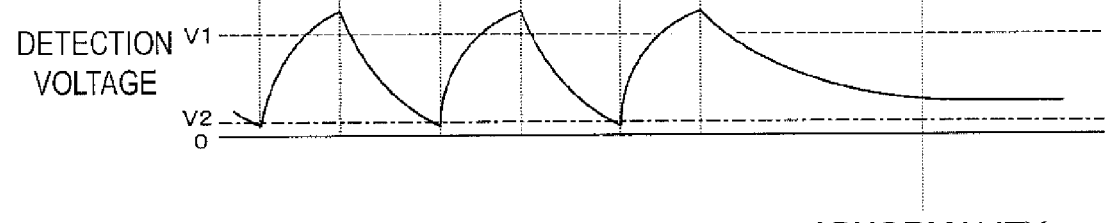

An abnormality determination performed by the abnormality determination unit 9 will be described below with reference to FIGS. 4A-4C.

As described above, the timer 10 measures the time interval after the pulse rises until the voltage at the coupling capacitor C1 becomes lower than the threshold V2. As illustrated in FIG. 4C, when the discharge determination unit 8 determines that the state in which the detection voltage does not become lower than the threshold V2 is continued for a given time τ, the abnormality determination unit 9 determines that the coupling capacitor C1 is not normally charged but the abnormality is generated.

For example, a breakdown of the discharge circuit 3 (e.g., a breakdown of the transistor) causes the abnormality. When the abnormality determination unit 9 determines the abnormality, the controller 1 performs processing such as an output of an abnormality signal. Therefore, the abnormality can be detected when the coupling capacitor C1 cannot be normally discharged.

In the above embodiment, by way of example, the discharge circuit 3 is provided in order to forcedly discharge the charge of the coupling capacitor C1. However, one or more embodiments of the present invention can also be applied to the case in which the discharge circuit 3 is not provided.

In this case, as illustrated in FIG. 1, a time for which the coupling capacitor C1 is discharged after the time the pulse falls is lengthened compared with the case in which the discharge circuit 3 is provided. Accordingly, pulse intervals T2 and T2' are longer than the pulse intervals T1 and T1' of FIGS. 3A-3C. However, the new pulse similarly rises at the time the voltage at the coupling capacitor C1 becomes lower than the threshold V2. Therefore, the pulse interval is shortened compared with the case in which the threshold V2 is not provided, and the electric leakage can quickly be detected.

Various embodiments other than the embodiments described above can be made in the present invention. In FIG. 1, the filter circuit including the resistor R3 and the capacitor C2, and the discharge circuit 4 that forcedly discharges the charge of the capacitor C2 are provided by way of example. Alternatively, the filter circuit and the discharge circuit 4 may be eliminated in one or more embodiments of the present invention.

In the above embodiment, at the timing the pulse output from the pulse generator 2 falls, the voltage detector 6 detects the voltage at the coupling capacitor C1, and the electric leakage determination unit 7 determines the presence or absence of the electric leakage. However, one or more embodiments of the present invention is not limited thereto. For example, at a predetermined time before the pulse falls, the voltage detector 6 may perform the voltage detection, and the electric leakage determination unit 7 may determine the presence or absence of the electric leakage.

Moreover, in the above embodiment, by way of example, the next pulse rises at the time the voltage at the coupling capacitor C1 becomes lower than the threshold V2. Alternatively, the next pulse may rise at the time which is slightly delayed from the time the voltage at the coupling capacitor C1 becomes lower than the threshold V2.

Moreover, in the above embodiment, by way of example, the discharge circuit 3 includes the transistor Q1 and the resistors R4 and R5. Alternatively, the discharge circuit 3 may include a coil and a relay having a contact. The same holds true for the discharge circuit 4.

Further, in the above embodiment, by way of example, the present invention is applied to the electric leakage detection apparatus mounted on the vehicle. Alternatively, the present invention may be applied to an electric leakage detection apparatus that is used in applications other than the vehicle.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An electric leakage detection apparatus comprising:
a coupling capacitor whose one end is connected to a DC power supply;
a pulse generator that supplies a pulse to the other end of the coupling capacitor;
a voltage detector that detects a voltage at the coupling capacitor charged with the pulse;
an electric leakage determination unit that compares the voltage detected by the voltage detector to a first threshold and determines presence or absence of an electric leakage of the DC power supply based on a comparison result; and
a discharge determination unit that compares the voltage detected by the voltage detector to a second threshold lower than the first threshold and determines whether the voltage becomes lower than the second threshold by a discharge of the coupling capacitor, wherein
the pulse generator generates a new pulse when the discharge determination unit determines that the voltage becomes lower than the second threshold.

2. The electric leakage detection apparatus according to claim 1, further comprising an abnormality determination unit that determines generation of an abnormality when the discharge determination unit determines that a state in which the voltage does not become lower than the second threshold is continued for a given time after the pulse falls.

3. The electric leakage detection apparatus according to claim 1, further comprising a discharge circuit that forcedly discharges a charge of the coupling capacitor during a time interval after the pulse falls and before the next pulse rises.

4. The electric leakage detection apparatus according to claim 1, wherein the electric leakage determination unit determines the presence or absence of the electric leakage at a predetermined time during a time interval after the pulse rises and before the voltage at the coupling capacitor is saturated.

5. The electric leakage detection apparatus according to claim 1, wherein the electric leakage determination unit determines the presence or absence of the electric leakage every time the pulse generator outputs the new pulse.

* * * * *